(12) United States Patent
Kuhlman et al.

(10) Patent No.: US 9,955,582 B2
(45) Date of Patent: Apr. 24, 2018

(54) 3-D STACKING OF ACTIVE DEVICES OVER PASSIVE DEVICES

(75) Inventors: Mark A. Kuhlman, Laguna Niguel, CA (US); Anthony James LoBianco, Irvine, CA (US); Thomas Noll, Sandown, NH (US); Robert W. Warren, Newport Beach, CA (US); Howard E. Chen, Anaheim, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/107,890

(22) Filed: Apr. 23, 2008

(65) Prior Publication Data

US 2009/0267220 A1 Oct. 29, 2009

(51) Int. Cl.
| | | |
|---|---|---|
| H01L 23/04 | (2006.01) | |
| H01L 21/00 | (2006.01) | |
| H05K 1/18 | (2006.01) | |
| H01L 23/31 | (2006.01) | |
| H01L 23/00 | (2006.01) | |
| H01L 25/16 | (2006.01) | |
| H05K 3/28 | (2006.01) | |
| H05K 3/32 | (2006.01) | |

(52) U.S. Cl.
CPC ......... *H05K 1/181* (2013.01); *H01L 23/3121* (2013.01); *H01L 24/32* (2013.01); *H01L 24/73* (2013.01); *H01L 25/16* (2013.01); *H01L 24/48* (2013.01); *H01L 2224/16265* (2013.01); *H01L 2224/32225* (2013.01); *H01L 2224/48091* (2013.01); *H01L 2224/48227* (2013.01); *H01L 2224/48471* (2013.01); *H01L 2224/48472* (2013.01); *H01L 2224/73257* (2013.01); *H01L 2224/73265* (2013.01); *H01L 2924/00014* (2013.01); *H01L 2924/01033* (2013.01); *H01L 2924/01047* (2013.01); *H01L 2924/01082* (2013.01); *H01L 2924/07802* (2013.01); *H01L 2924/14* (2013.01); *H01L 2924/1433* (2013.01); *H01L 2924/181* (2013.01); *H01L 2924/19041* (2013.01); *H01L 2924/19103* (2013.01); *H01L 2924/19104* (2013.01); *H05K 3/284* (2013.01); *H05K 3/321* (2013.01); *H05K 2201/1053* (2013.01); *H05K 2201/10166* (2013.01); *H05K 2201/10515* (2013.01); *H05K 2201/10636* (2013.01); *Y02P 70/611* (2015.11)

(58) Field of Classification Search
CPC ................................ H01L 23/04; H01L 21/00
USPC ........................ 257/724, E23.001, E23.169
See application file for complete search history.

(56) References Cited

U.S. PATENT DOCUMENTS

| | | | |
|---|---|---|---|
| 5,514,907 A | | 5/1996 | Moshayedi |
| 5,670,824 A | | 9/1997 | Weinberg |
| RE36,916 E | | 10/2000 | Moshayedi |
| 6,127,724 A | * | 10/2000 | DiStefano ............... 257/675 |

(Continued)

*Primary Examiner* — Peniel M Gumedzoe
(74) *Attorney, Agent, or Firm* — Chang & Hale LLP

(57) ABSTRACT

Single-die or multi-die packaged modules that incorporate three-dimensional integration of active devices with discrete passive devices to create a package structure that allows active devices (such as, silicon or gallium-arsenide devices) to share the same footprint area as an array of passive surface mount components. In one example, a module includes at least one active device stacked on top of an array of passive surface mount components on a substrate. A conductive or non-conductive adhesive can be used to adhere the active device to the array of passive devices.

17 Claims, 5 Drawing Sheets

(56) References Cited

U.S. PATENT DOCUMENTS

| | | | |
|---|---|---|---|
| 6,400,008 B1 | 6/2002 | Farnworth | |
| 6,428,349 B1 | 8/2002 | Dickson et al. | |
| 6,521,997 B1 * | 2/2003 | Huang et al. | 257/737 |
| 6,538,313 B1 * | 3/2003 | Smith | 257/684 |
| 6,781,222 B2 * | 8/2004 | Wu et al. | 257/684 |
| 6,783,371 B2 | 8/2004 | Self et al. | |
| 6,803,655 B2 * | 10/2004 | Fujio et al. | 257/724 |
| 6,865,089 B2 | 3/2005 | Ho et al. | |
| 6,867,492 B2 * | 3/2005 | Auburger | H01L 23/3677 257/675 |
| 6,972,964 B2 | 12/2005 | Ho et al. | |
| 6,995,448 B2 * | 2/2006 | Lee et al. | 257/516 |
| 7,005,325 B2 | 2/2006 | Chow et al. | |
| 2002/0041027 A1 * | 4/2002 | Sugizaki | 257/737 |
| 2003/0075811 A1 | 4/2003 | Cohn et al. | |
| 2004/0067605 A1 * | 4/2004 | Koizumi | 438/108 |
| 2004/0124513 A1 | 7/2004 | Ho et al. | |
| 2004/0184219 A1 * | 9/2004 | Otsuka | H01L 23/49805 361/306.3 |
| 2005/0212134 A1 * | 9/2005 | Pu | 257/738 |
| 2006/0145339 A1 * | 7/2006 | Yang et al. | 257/724 |
| 2007/0096282 A1 * | 5/2007 | Shim et al. | 257/686 |
| 2007/0194419 A1 * | 8/2007 | Ozawa | H01L 23/50 257/678 |

\* cited by examiner

3-D STACKING OF ACTIVE DEVICES OVER PASSIVE DEVICES

BACKGROUND

Field of Invention

The present invention relates generally to semiconductor modules and methods for packaging the same and, more particularly, to semiconductor modules that incorporate three dimensional stacking of devices.

Discussion of Related Art

Electronic modules generally include active integrated circuits (ICs) and associated analog circuitry situated and interconnected on a main substrate board. One or more metallization layers on the substrate board provide conductive traces that interconnect the various electronic devices making up the module. The current technology for "system in package" modules combines active devices (e.g., CMOS devices formed in silicon) with discrete surface mount passive components (e.g., capacitors, inductors and resistors) in a two dimensional planar geometry on a substrate board, to provide a module with a given electrical function. Generally, the active devices are located near the center of the board, while the passive components are located around the edges of the board.

For many applications, including cellular handset and other wireless/mobile applications, it is important that the size of the main substrate board be as small as possible. One factor requiring reductions in the size of the board is the physical dimension of an associated product which makes use of the board (e.g., a cellular handset or MP3 player). Therefore, higher density modules are desirable to pack more functionality into less space. Accordingly, it becomes crucial to configure and package the individual module devices so that the surface area of the substrate board is optimized.

There have been several attempts to address the problem of adding increased functionality to substrate boards with limited space. Many of these include methods of packaging devices, including integrated circuits, in a vertical, or three-dimensional, geometry. For example, thin film technology has been used to stack one active die on top of another, particularly to create high density memory devices. A thin film of adhesive is disposed over the lower die to act as a spacer and allow another die to be stacked on top of, and secured to, the lower die. The adhesive is thermally sensitive such that it can be heated and applied over the lower die in liquid form so as not to bend the bond wires that connect the lower die to the substrate board. This process allows stacking of multiple, similar, active devices, for example, stacking of memory ICs with other application specific integrated circuits (ASICs).

In another example, where a great number of passive devices are required in a high density circuit, active devices have been stacked over integrated passive devices. The term "integrated passive device" as used herein refers to a passive device that is integrally formed with a substrate, such as a printed circuit board. Integrated passive devices are created using semiconductor processing techniques, such as dielectric film and metal deposition (e.g., silicon on insulator and/or thin-film technology). Active devices can then be disposed on substrates that incorporate integrated passive devices, resulting in stacking of the active devices above the integrated passive devices. This approach is often presently preferred because stacking similar device technologies, for example, a CMOS ASIC with a CMOS passive network, uses processes that are already used for stacking multiple active devices (e.g., stacking memory ICs with ASICs), as discussed above. One such example that combines integrated passive devices with active ICs is described in U.S. Pat. No. 5,670,824 to Weinberg, entitled "Vertically integrated device assembly incorporating active and passive components" which discloses an electronic assembly formed as a multi-layered structure having integrated passive devices disposed on a substrate layer.

SUMMARY OF INVENTION

Although conventional methods of stacking of active devices over one another or over integrated passive devices provide some increase in board density and/or some reduction in substrate size, neither solution is ideal. Stacking of active devices over one another does not reduce the space required by passive devices in the module, which can be a large percentage of the total substrate surface area. As discussed further below, integrated passive devices are expensive and time-consuming to manufacture compared to surface mount passive devices. Therefore, although stacking of active devices over integrated passive devices can result in higher density circuit boards, the use of integrated passive devices can be undesirable, particularly for low cost, high volume applications.

Accordingly, to address these and other disadvantages present in the prior art, aspects and embodiments of the present invention are directed to electronic modules that incorporate stacking of active devices over surface mount passive devices.

One embodiment of a semiconductor packaged module comprises a substrate having first and second conductive traces disposed thereon, at least one passive surface mount component having an upper surface and a lower surface, at least a portion of the lower surface being connected to the first conductive trace, and an active device adhered to the upper surface of the at least one passive surface mount component by an adhesive. In one example, the adhesive is an epoxy paste. The adhesive may be conductive or non-conductive. In one example, the at least one passive surface mount component comprises a body and a connection terminal, the connection terminal being electrically connected to the first conductive trace. In this example, the adhesive may be conductive and disposed between a selected portion of the active device and the upper surface of the connection terminal. In another example, a wire bond is used to electrically connect the active device to the second conductive trace. Molding compound may be used to encapsulate the active device.

According to another embodiment, a method of packaging a semiconductor module comprises connecting a passive surface mount component to a substrate, and mounting an active device on top of the passive surface mount component. In one example, mounting the active device includes adhering the active device to the passive surface mount component using an adhesive. In one example, adhering the active device to the passive surface mount component includes disposing a layer of adhesive on a surface of the active device and mounting the active device to the passive surface mount component such that the adhesive is interposed between the active device and the passive surface mount component. In another example, adhering the active device to the passive surface mount component includes disposing a conductive adhesive on a connection terminal of the passive surface mount component, aligning a connection pad on the active device with the connection terminal of the passive surface mount component, and bonding and electrically connecting the connection pad to the connection terminal with the conductive adhesive. The method may further comprise encapsulating the active device with a molding compound. In another example, the method includes connecting a plurality of passive surface mount components to the substrate, and mounting the active device may include disposing a layer of adhesive on the active device, and mounting the active device on top of the plurality of passive surface mount components with the layer of adhesive interposed between the plurality of passive surface mount components and the active device. The method may further comprise curing the layer of adhesive to bond the active device to the plurality of passive surface mount components.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

Figure 1:
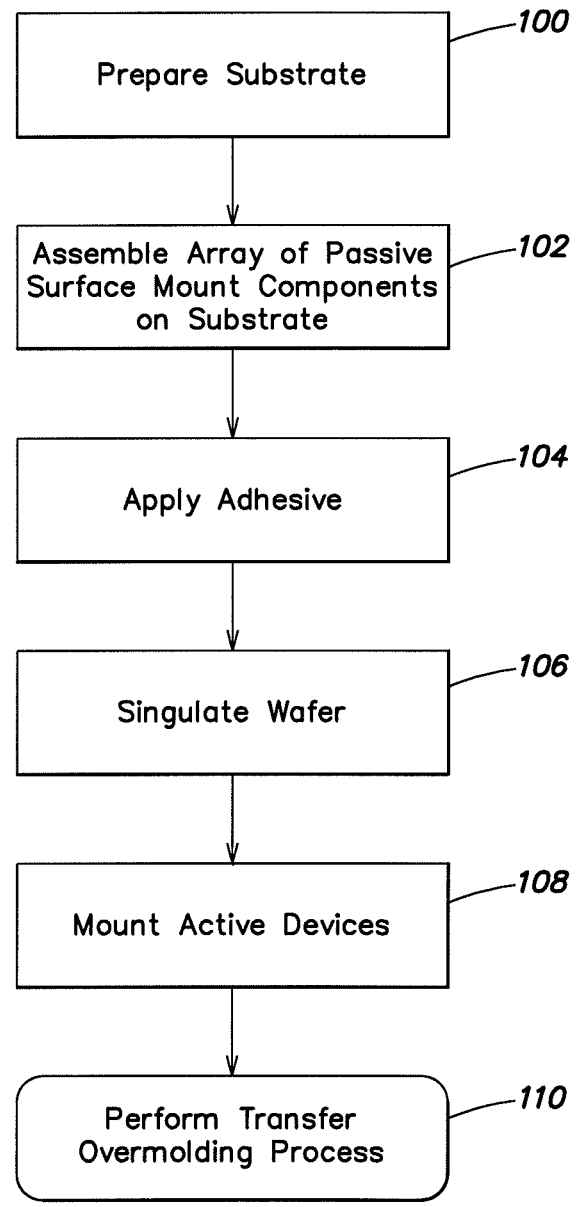
FIG. 1 is a flow diagram of one example of an assembly method according to aspects of the invention.

As discussed above, in order to accommodate the growing demand for smaller and more complex electronic devices, designers have moved toward electronic modules that incorporate vertically stacked devices in a three-dimensional (3-D) geometry. Conventionally, for 3-D modules that comprise many passive devices, the tendency has been to stack active integrated circuits (ICs) over integrated passive devices. These integrated passive devices are formed using semiconductor fabrication technologies (e.g., silicon-on-insulator technology, thin-film technology, etc.) and are incorporated into the module during die fabrication and assembly, which typically occurs in a clean room environment.

Although the use of integrated passive devices allows some increase in the effective surface area of the substrate board (by enabling vertical stacking of active ICs above the integrated passive devices), there are several disadvantages associated with it. For example, integrated passive devices are formed and assembled on the substrate board with the active dies, using high technology semiconductor processes. These processes, such as semiconductor doping, masking, etching, metal deposition, oxidation, etc. are relatively slow and expensive processes, and generally must be performed in a clean room environment. Maintaining a clean room can also be relatively expensive. In addition, because integrated passive devices are integrally formed with the die, adding additional devices to a module or replacing defective devices can be difficult and expensive.

By contrast, surface mount passive components are discrete devices, separate from the active dies, generally comprising a ceramic body with solderable terminals for attaching the surface mount passive component to the substrate board. Some common examples of surface mount passive components include resistors, inductors and capacitors. Surface mount components are generally positioned on the substrate board and attached using soldering techniques (e.g., wave or reflow soldering) either before or after die assembly is complete. Assembly machines are capable of placing surface mount components on a substrate at a rate of up to about 50,000 components per hour. In addition, placement and soldering of surface mount passive components are generally part of the printed circuit board assembly, rather than the active die assembly, and do not need to occur in a clean room. Thus, in many instances, the use of surface mount passive components is desirable, particularly for low cost, high volume applications.

Accordingly, aspects and embodiments are directed to packaged multi-die modules, and methods of assembly thereof, that incorporate stacking of active devices over internal discrete surface mount passive components. Such three-dimensional stacking of active ICs over surface mount passive components can reduce the size of the substrate for a given package and/or can increase the device density for a given substrate surface area. This allows module designers to achieve the same or greater functionality in a smaller package form factor. In addition, packaged three-dimensional modules according to aspects of the invention can be assembled using high speed assembly processes and low cost surface mount components, and may also allow improved design flexibility, as discussed further below.

It is to be appreciated that embodiments of the methods and apparatuses discussed herein are not limited in application to the details of construction and the arrangement of devices set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Referring to FIG. 1, there is illustrated a flow diagram of one example of a method of assembly and packaging of a multi-die module that incorporates stacking of active ICs directly above an array of discrete, passive surface mount components, in accordance with aspects of the invention. Aspects and embodiments of the method are discussed below with continuing reference to FIG. 1.

Figure 2:
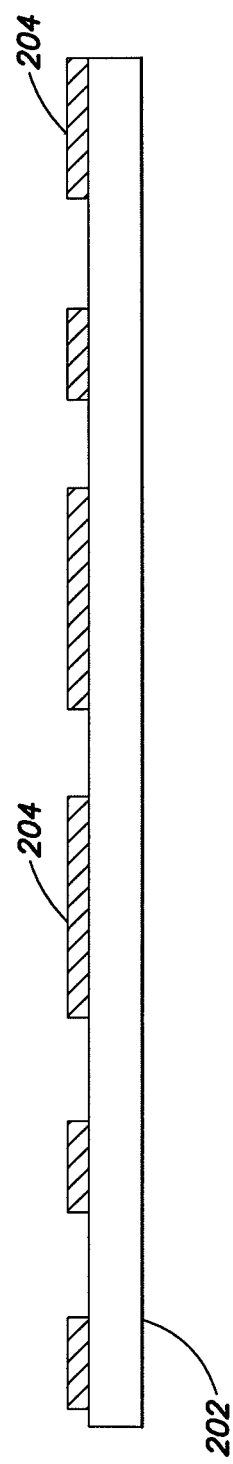
FIG. 2 is a cross-sectional diagram of one example of a substrate.

In a first step 100, a substrate or carrier is prepared for assembly. Referring to FIG. 2, there is illustrated a cross-sectional diagram of a substrate 202. The preparation step may include depositing one or more layers of metallization to form conductive traces 204 that will be used to connect the active devices and passive components included in the module.

Figure 3:
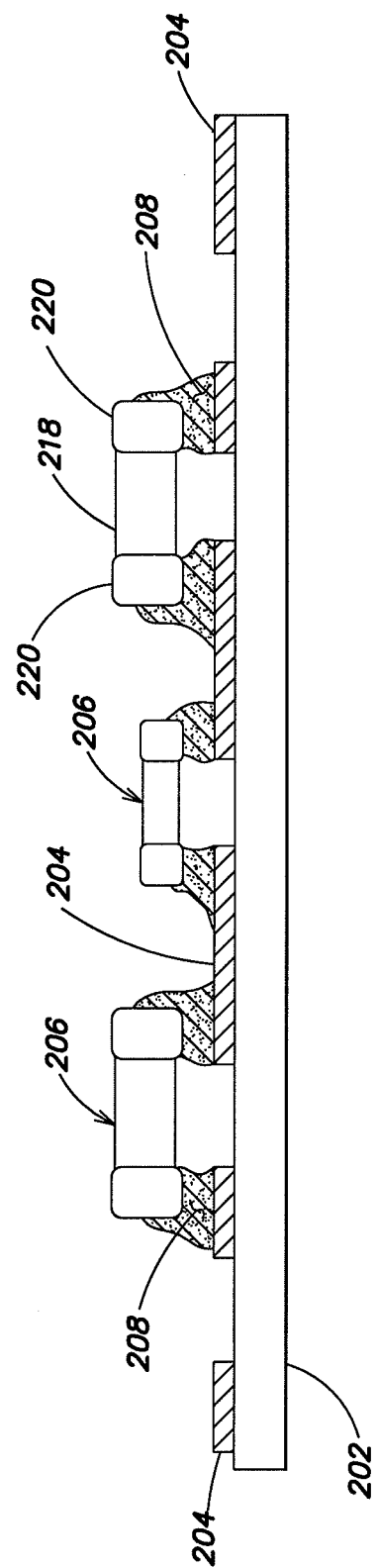
FIG. 3 is a cross-sectional diagram of the substrate of FIG. 2 with an array of passive surface mount components disposed thereon.

In a next step 102, one or more passive surface mount components may be assembled onto the substrate 202. FIG. 3 illustrates the substrate 202 with several passive surface mount components 206 connected to the traces 204 via a conductive material 208. As discussed above, the passive surface mount components 206 include a body 218 and connection terminals 220. The passive surface mount components 206 may be assembled on the substrate 202 using conventional system-in-package assembly techniques. For example, the passive surface mount components 206 may be soldered down (e.g., by wave or reflow soldering) or attached using conductive epoxy. Thus, the conductive material 208 may include solder, lead-free solder, silver epoxy, or other materials that can be used to attach the connection terminals 220 of the passive surface mount components 206 to the conductive traces 204 and form an electrical connection between the connection terminals 220 and the conductive traces 204. The passive surface mount components 206 may be of any size, for example, 0402, 0201, 01005, etc. In one example, smaller and thinner passive surface mount components 204 allow for greater device density in a given surface area, thinner overall package profile, and shorter interconnect distances between the traces 204 and the active devices stacked above the passive surface mount components (see FIG. 4).

Furthermore, it is to be appreciated that two or more surface mount passive components may be combined into a single surface mount device. For example, a bank of several capacitors or resistors may be supplied as a single surface mount device. Therefore, the term "passive surface mount component" as used herein is intended to refer to both single component devices and multi-component devices.

Figure 4:
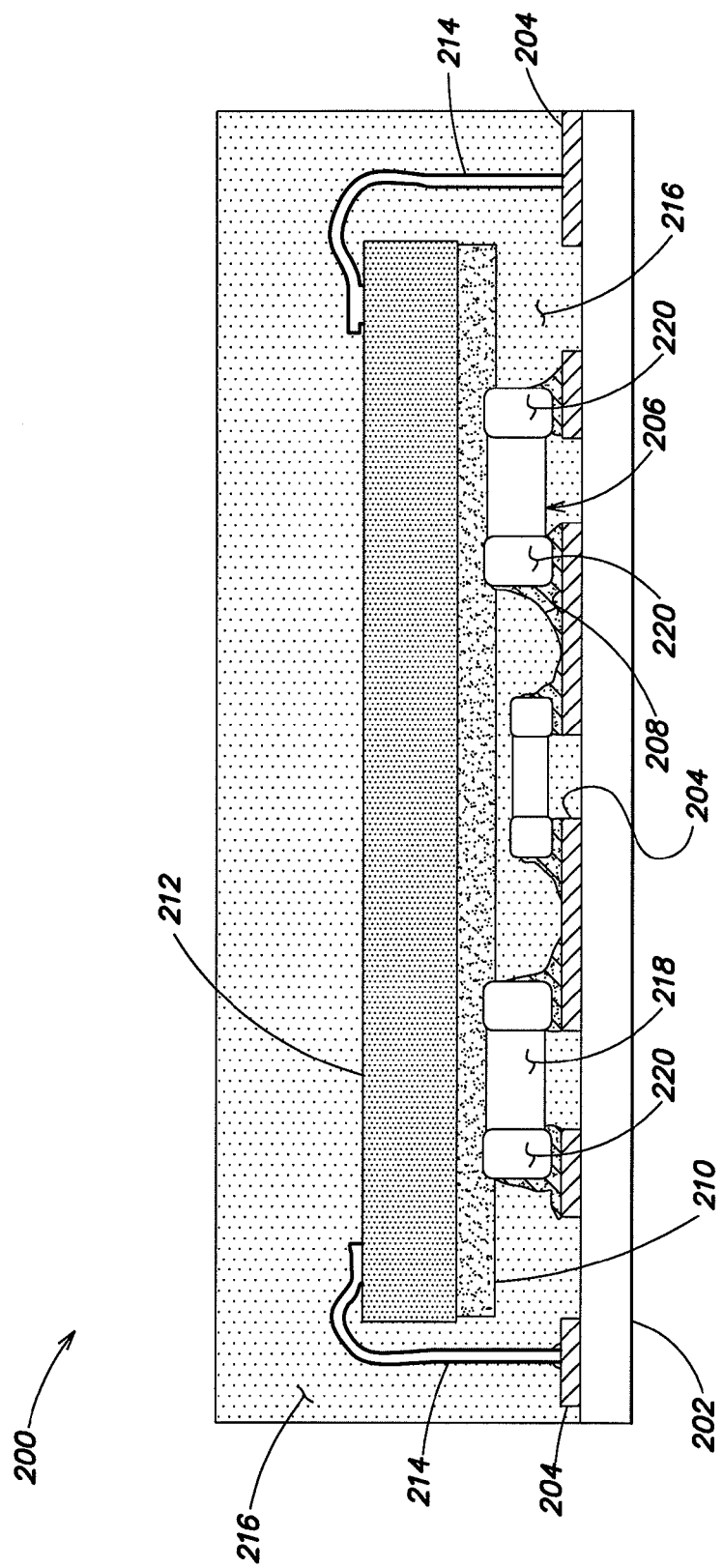
FIG. 4 is a cross-sectional diagram of one example of an electronic module including an active device stacked above a surface mount passive device, according to aspects of the invention.

Referring again to FIG. 1, in step 104, an adhesive, such as, for example, an epoxy paste, may be applied over the array of passive surface mount components or, alternatively, to the active dies that are to be attached to the substrate. This adhesive may be used to adhere the active devices to the array of passive devices. Referring to FIG. 4, there is illustrated one example of a module 200 comprising an active die 212 mounted above an array of passive surface mount components 206, in accordance with aspects of the invention. In one embodiment, a non-conductive adhesive film or paste 210 can be applied to one side (referred to as the "back") of the active die 212. The die 212 may then be placed directly on top of the array of passive surface mount components 206 (step 108), and the adhesive 210 may be cured, if necessary. The non-conductive adhesive 210 on the back of the active die 212 adheres to the tops of the passive surface mount components 206, providing a stable platform under the active die 212 to support the die. The die 212 then may be wire-bonded (using wire-bonds 214) to conductive traces 204 on the substrate 202 to provide electrical connection to the die.

According to another embodiment, the layer of adhesive film or paste may be applied to the tops of at least some of the passive surface mount components 206. As discussed above, the adhesive film or paste may be non-conductive, in which case it may be applied over the body 218 or and/or connection terminals 220 of the passive surface mount component(s) 206. It is to be appreciated that numerous variations on the adhesive layer 210 are possible. For example, in some instances where the adhesive layer is a non-conductive adhesive film, it may have a substantially uniform appearance, as illustrated in FIG. 4. In other examples, in which the adhesive may be conductive (and therefore, may be only desired in limited locations on the active die) or may include a paste or solder, rather than a film, the appearance of the adhesive layer may be more discontinuous or non-uniform, as illustrated, for example, in FIG. 5.

Figure 5:
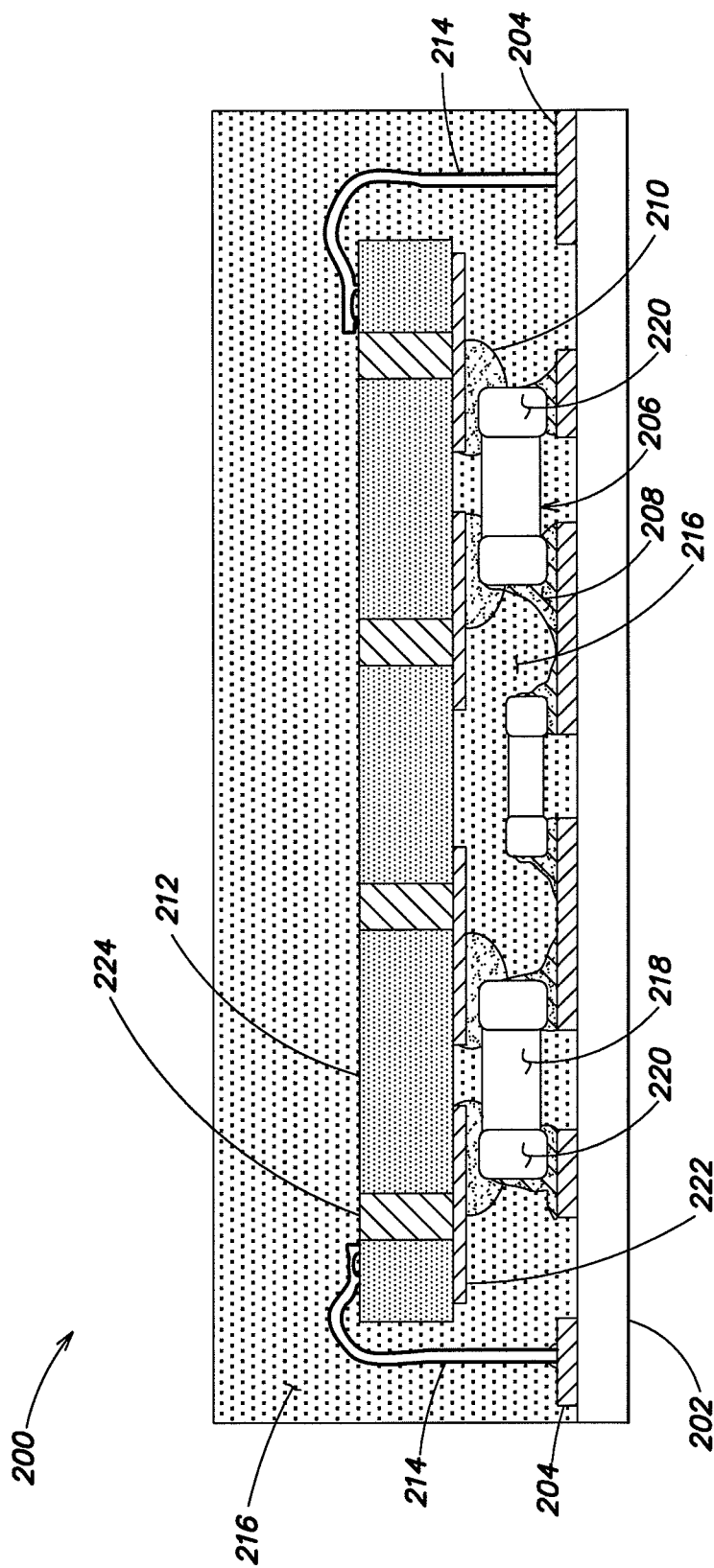
FIG. 5 is cross-sectional diagram of another example of an electronic module including an active device stacked above a surface mount passive device, according to aspects of the invention.

As discussed above, in another example, the adhesive may be conductive and may be used not only to adhere the active die 212 to the array of passive surface mount components 206, but also to form an electrical connection between selected ones of the passive surface mount components 206 and the die 212. Referring to FIG. 5, in one example, the conductive adhesive film or paste 210 is applied to the connection terminals 220 of the selected passive surface mount components to which the die 212 is to be connected. Alternatively, the conductive adhesive 210 may be applied to selected connection pads 222 on the active die 212 which may then be aligned with the connection terminals 220 of selected passive surface mount components to which the die 212 is to be connected. In one example, conductive vias 224 may be provided extending through, or partially through, the active die 212, as illustrated in FIG. 5, to provide further electrical connection to the active die and/or to components (not shown) coupled to the active die.

In one example, the active die 212 may be formed on a wafer that comprises multiple dies, as known in the art. Therefore, according to one embodiment, a layer of adhesive may be applied over one side of the wafer, which may then be singulated into the individual dies (step 106). The die(s) are then mounted to the top of the array of passive surface mount components, as discussed above. In another example, the substrate 202 is a carrier wafer upon which multiple module layouts are arranged. In this example, the step 106 includes singulating the carrier wafer into multiple individual substrates to provide corresponding multiple individual modules. It is to be appreciated that although the flow diagram in FIG. 1 illustrates the steps of applying adhesive (step 104), singulating the wafer(s) (step 106) and mounting the active devices (step 108) as being sequential, the invention is not so limited. Rather, step 106 of singulating the active die wafer and/or carrier wafer may be performed before the adhesive is applied (step 104) or, in the case of singulating the carrier wafer, after the active devices are mounted (step 108).

Referring again to FIG. 1, after the active dies 212 have been bonded to the array of passive surface mount components, appropriate electrical connections have been made to the die (e.g., via wire-bonding or direct connections to selected passive surface mount components), and the die wafer and/or carrier wafer have been singulated (if necessary), the module 200 is ready for packaging to be completed. Thus, in step 110 the module undergoes a transfer overmolding process. A standard transfer overmolding process, known to those skilled in the art, may be used. According to one example, the active die becomes completely encapsulated from above and below (i.e., around the passive surface mount components to which the die is attached) in a molding compound 216, as shown in FIG. 4.

It is to be appreciated that although a single-die module 200 is illustrated in FIG. 4, the principles discussed above may also be used to provide multi-die modules. For example, multiple dies 212 may be adhered, and optionally electrically connected to, the array of passive surface devices 206 by applying adhesive to each die, or by applying adhesive to some or all of the passive surface devices, as discussed above, and appropriately aligning and adhering the multiple dies. The molding compound 216 may then be applied to encapsulate all the dies to form a packaged module.

Thus, methods and apparatus according to aspects and embodiments of the invention may be used to provide single- or multi-die packaged modules that allow three-dimensional integration of active devices with standard, widely available, low cost, discrete passive devices in lieu of using integrated passive devices that tend to be more expensive and require longer development and manufacturing cycle times. In addition, by creating a package structure that allows active devices (such as, a silicon controller or gallium-arsenide switch, etc.) to share the same footprint area as the array of passive surface mount components, the package footprints can be reduced.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A semiconductor packaged module comprising:
   a substrate having first and second conductive traces disposed thereon;
   at least one passive surface mount component having an upper surface and a lower surface, at least a portion of the lower surface being connected to the first conductive trace;
   an active device adhered to the upper surface of the at least one passive surface mount component by a conductive adhesive, the active device electrically connected to the second conductive trace by a wire bond; and
   a molding compound substantially encapsulating the upper surface and the lower surface of the at least one passive surface mount component, the active device being electrically connected to the at least one passive surface mount component via the conductive adhesive and the active device being supported above the substrate by the at least one passive surface mount component, at least a portion of the conductive adhesive, and the molding compound.

2. The semiconductor packaged module of claim 1 wherein the conductive adhesive includes solder.

3. The semiconductor packaged module of claim 1 wherein the at least one passive surface mount component comprises a body and a connection terminal, wherein the connection terminal is electrically connected to the first conductive trace, wherein the adhesive is conductive, and wherein the adhesive is disposed between a selected portion of the active device and an upper surface of the connection terminal.

4. The semiconductor packaged module of claim 1 wherein the molding compound substantially encapsulates the active device.

5. A method of packaging a semiconductor module, the method comprising:
   connecting a passive surface mount component to a substrate;
   mounting an active device to an upper surface of the passive surface mount component by adhering the active device to the upper surface of the passive surface mount component using an adhesive;
   electrically connecting the active device to the second conductive trace by a wire bond;
   electrically connecting the active device to the passive surface mount component; and
   encapsulating the upper surface of the passive surface mount component with a molding compound, the active device being supported above the substrate by the at least one passive surface mount component, at least a portion of the adhesive, and the molding compound.

6. The method of claim 5 wherein adhering the active device to the upper surface of the passive surface mount component comprises disposing a layer of adhesive on a surface of the active device and mounting the active device to the passive surface mount component such that the adhesive is interposed between the active device and the upper surface of the passive surface mount component.

7. The method of claim 5 wherein adhering the active device to the upper surface of the passive surface mount component and electrically connecting the active device to the passive device comprise:
   disposing a conductive adhesive on a connection terminal of the passive surface mount component;
   aligning a connection pad on the active device with the connection terminal of the passive surface mount component; and
   bonding and electrically connecting the connection pad to the connection terminal with the conductive adhesive.

8. The method of claim 5 further comprising encapsulating the active device with the molding compound.

9. The method of claim 5 wherein connecting a passive surface mount component to the substrate comprises connecting a plurality of passive surface mount components to the substrate.

10. The method of claim 9 wherein mounting the active device comprises:
    disposing a layer of adhesive on the active device; and
    mounting the active device to upper surfaces of the plurality of passive surface mount components with the layer of adhesive interposed between the upper surfaces of the plurality of passive surface mount components and the active device.

11. The method of claim 10 further comprising curing the layer of adhesive to bond the active device to the plurality of passive surface mount components.

12. The method of claim 5 wherein mounting the active device to the upper surface of the passive surface mount component and electrically connecting the active device to the passive surface mount device comprise soldering an electrical connection pad on the active device to an electrical connection terminal on the passive surface mount component.

13. A semiconductor packaged module comprising:
- a substrate having first and second conductive traces disposed thereon;
- a passive surface mount component disposed on the substrate; and
- an active device adhered to an upper surface of the passive surface mount component by a conductive adhesive, the active device electrically connected to the second conductive trace by a wire bond; and
- a molding compound substantially encapsulating the upper surface of the at least one passive surface mount component, the active device being electrically connected to the passive surface mount component by the conductive adhesive and the active device being supported above the substrate by the at least one passive surface mount component, at least a portion of the conductive adhesive, and the molding compound.

14. The semiconductor packaged module of claim 13 wherein the passive surface mount component is electrically connected to the first conductive trace.

15. The semiconductor packaged module of claim 13 wherein the molding compound is disposed over the active device and substantially encapsulates the active device.

16. The semiconductor packaged module of claim 13 wherein the conductive adhesive comprises solder.

17. The semiconductor packaged module of claim 13 wherein the at least one passive surface mount component comprises a body and a connection terminal, wherein the connection terminal is electrically connected to the first conductive trace, wherein the adhesive is conductive, and wherein the adhesive is disposed between a selected portion of the active device and an upper surface of the connection terminal.

* * * * *